(12) United States Patent
Kimura et al.

(10) Patent No.: US 9,972,707 B2
(45) Date of Patent: May 15, 2018

(54) SEMICONDUCTOR DEVICE

(71) Applicants: Keisuke Kimura, Nagakute (JP); Satoru Kameyama, Toyota (JP)

(72) Inventors: Keisuke Kimura, Nagakute (JP); Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 1 day.

(21) Appl. No.: 15/104,073

(22) PCT Filed: Sep. 8, 2014

(86) PCT No.: PCT/JP2014/073676
§ 371 (c)(1),
(2) Date: Jun. 13, 2016

(87) PCT Pub. No.: WO2015/118714
PCT Pub. Date: Aug. 13, 2015

(65) Prior Publication Data
US 2016/0372584 A1 Dec. 22, 2016

(30) Foreign Application Priority Data

Feb. 10, 2014 (JP) ................................ 2014-023867

(51) Int. Cl.
*H01L 29/739* (2006.01)
*H01L 29/861* (2006.01)
(Continued)

(52) U.S. Cl.
CPC ...... *H01L 29/7397* (2013.01); *H01L 29/0649* (2013.01); *H01L 29/0834* (2013.01); *H01L 29/861* (2013.01); *H01L 29/407* (2013.01)

(58) Field of Classification Search
CPC ............. H01L 29/7397; H01L 29/0834; H01L 29/0649; H01L 29/861; H01L 21/74;
(Continued)

(56) References Cited

U.S. PATENT DOCUMENTS 5,241,210 A * 8/1993 Nakagawa .............. H01L 21/74
257/487
2002/0153586 A1 10/2002 Majumdar et al.
(Continued)

FOREIGN PATENT DOCUMENTS

JP H10-261704 A 9/1998
JP 2002-314082 A 10/2002
(Continued)

Primary Examiner — Mouloucoulaye Inoussa
(74) Attorney, Agent, or Firm — Oliff PLC

(57) ABSTRACT

A semiconductor device includes a main IGBT region in which an IGBT is provided, a main diode region in which a diode is provided, a sense IGBT region in which an IGBT is provided, and a sense diode region in which a diode is provided. A clearance between the body region and the anode region is longer than a product of electron mobility and electron lifetime in the n-type region between the body region and the anode region. A clearance between an end of the collector region on a sense diode region side and the body region is longer than a product of electron mobility and electron lifetime in the n-type region between the end and the body region.

4 Claims, 5 Drawing Sheets

(51) Int. Cl.
*H01L 29/08* (2006.01)
*H01L 29/06* (2006.01)
*H01L 29/40* (2006.01)

(58) Field of Classification Search
CPC .......... H01L 29/8611; H01L 21/76297; H01L 27/0623; H01L 29/1095; H01L 29/0696
USPC ................ 257/140, 487, 506, 509, 520, 545
See application file for complete search history.

(56) References Cited

U.S. PATENT DOCUMENTS

| | | | |
|---|---|---|---|
| 2009/0001411 A1* | 1/2009 | Tokura | ................ H01L 27/0664 257/140 |
| 2009/0057832 A1 | 3/2009 | Kouno | |
| 2011/0297934 A1 | 12/2011 | Soeno | |
| 2011/0298446 A1 | 12/2011 | Shiraki et al. | |
| 2013/0009206 A1* | 1/2013 | Soeno | ................ H01L 29/7397 257/140 |
| 2013/0248924 A1 | 9/2013 | Matsudai et al. | |

FOREIGN PATENT DOCUMENTS

| | | |
|---|---|---|
| JP | 2009-099690 A | 5/2009 |
| JP | 2010-192565 A | 9/2010 |
| JP | 2011-082220 A | 4/2011 |
| JP | 2011-134861 A | 7/2011 |
| JP | 2012-156370 A | 8/2012 |
| JP | 2013-201237 A | 10/2013 |
| WO | 2011/138832 A1 | 11/2011 |

\* cited by examiner

US 9,972,707 B2

SEMICONDUCTOR DEVICE

TECHNICAL FIELD

This application is related application of and claims priority to Japanese Patent Application No. 2014-023867 filed on Feb. 10, 2014, the entire contents of which are hereby incorporated by reference into the present application.

The art disclosed in the present specification relates to a semiconductor device.

BACKGROUND ART

International Publication No. WO2011/138832 discloses a semiconductor device that has an IGBT and a diode provided in the same semiconductor substrate. Moreover, aside from a main IGBT through which a main current flows, a sense IGBT through which a smaller current flows is provided in this semiconductor substrate. By detecting the current that flows through the sense IGBT, it is possible to detect a current that flows through the main IGBT. Moreover, aside from the main diode through which a main current flows, a sense diode through which a smaller current flows is provided in this semiconductor substrate. Moreover, by detecting the current that flows through the sense diode, it is possible to detect a current that flows through the main diode.

SUMMARY OF INVENTION

Technical Problem

In the above-mentioned semiconductor device, it is desirable to further improve detection accuracy of the sense IGBT and the sense diode.

Solution to Technical Problem

A first semiconductor device provided herein comprises a semiconductor substrate including a main IGBT region in which an IGBT is provided, a main diode region in which a diode is provided, a sense IGBT region in which an IGBT is provided, and a sense diode region in which a diode is provided. An area of the sense IGBT region is smaller than an area of the main IGBT region. An area of the sense diode region is smaller than an area of the main diode region. An n-type region is provided across the sense IGBT region and the sense diode region. An emitter region, a body region, the n-type region, a collector region, a gate insulating film, and a gate electrode are provided in the sense win region. The emitter region is of n-type and exposed on a front surface of the semiconductor substrate. The body region is of p-type and in contact with the emitter region. The n-type region is separated from the emitter region by the body region. The collector region is of p-type, exposed on a rear surface of the semiconductor substrate, and separated from the body region by the n-type region. The gate insulating film is in contact with the body region. The gate electrode faces the body region via the gate insulating film. An anode region and the n-type region are provided in the sense diode region. The anode region is of p-type and exposed on the front surface of the semiconductor substrate. The n-type region is in contact with the anode region and exposed on the rear surface of the semiconductor substrate. The body region is separated from the anode region by the n-type region. A clearance between the body region and the anode region is longer than a product of electron mobility and electron lifetime in the n-type region between the body region and the anode region. The anode region is separated from the collector region by the n-type region. A clearance between the anode region and the collector region is longer than a product of electron mobility and electron lifetime in the n-type region between the anode region and the collector region. A clearance between an end of the collector region on a sense diode region side and the body region is longer than a product of electron mobility and electron lifetime in the n-type region between the end and the body region.

Notably, in the present specification, the term "area" means an area when the semiconductor substrate is seen along its thickness direction.

In this semiconductor device, the clearance between the body region and the anode region is longer than the product of electron mobility and electron lifetime in the n-type region between the body region and the anode region. Accordingly, movement of carriers between the body region and the anode region is suppressed. Moreover, in this semiconductor device, the clearance between the anode region and the collector region is longer than the product of electron mobility and electron lifetime in the n-type region between the anode region and the collector region. Accordingly, movement of carriers between the anode region and the collector region is suppressed. Moreover, in this semiconductor device, the clearance between the end of the collector region on the sense diode region side and the body region is longer than the product of electron mobility and electron lifetime in the n-type region between the end and the body region. On the sense diode region side in the collector region, the n-type region is exposed on the rear surface of the semiconductor substrate. This n-type region thus exposed functions as a so-called cathode of the diode. In other words, the clearance between the end and the body region corresponds to a clearance between the cathode of the diode and the body region. Since this clearance is longer than the product of electron mobility and electron lifetime in the n-type region, the movement of carriers between the cathode and the body region is suppressed. As such, in this semiconductor device, the movement of carriers between the sense IGBT region and the sense diode region is suppressed. In other words, a current interference between the sense IGBT and the sense diode is suppressed. The current in each of the sense IGBT region and the sense diode region can therefore be detected correctly.

The first semiconductor device described above may further comprise an external p-type region exposed on the rear surface of the semiconductor substrate in a region located on an opposite side of the sense IGBT region with respect to the sense diode region. The anode region may be separated from the external p-type region by the n-type region. A clearance between the anode region and the external p-type region may be longer than a product of electron mobility and electron lifetime in the n-type region between the anode region and the external p-type region.

According to such a configuration, the movement of carriers between the anode region and the external p-type region can be suppressed.

A second semiconductor device provided herein comprises a semiconductor substrate including a main IGBT region in which an IGBT is provided, a main diode region in which a diode is provided, a sense IGBT region in which an IGBT is provided, and a sense diode region in which a diode is provided. An area of the sense IGBT region is smaller than an area of the main IGBT region. An area of the sense diode region is smaller than an area of the main diode region. An emitter region, a body region, an IGBT drift region, a collector region, a gate insulating film, and a gate electrode are provided in the sense IGBT region. The emitter region is of n-type and exposed on a front surface of the semiconductor substrate. The body region is of p-type and in contact with the emitter region. The IGBT drift region is separated from the emitter region by the body region. The collector region is of p-type, exposed on a rear surface of the semiconductor substrate, and separated from the body region by the IGBT drift region. The gate insulating film is in contact with the body region. The gate electrode faces the body region via the gate insulating film. An anode region, a diode drift region and a cathode region are provided in the sense diode region. The anode region is of p-type and exposed on the front surface of the semiconductor substrate. The diode drift region is in contact with the anode region. The cathode region is of n-type, is separated from the anode region by the diode drift region, is exposed on the rear surface of the semiconductor substrate, and has a higher n-type impurity density than the diode drift region. The body region is separated from the anode region by the IGBT drift region and the diode drift region. A high density n-type region having a higher n-type impurity density than the IGBT drift region and the diode drift region is provided between the IGBT drift region and the diode drift region.

In the high density n-type region having a higher n-type impurity density, carriers are scattered by n-type impurities or defects. Since in this semiconductor device, the high density n-type region is provided between the IGBT drift region and the diode drift region, the movement of carriers between the sense IGBT region and the sense diode region is suppressed. The current in each of the sense IGBT region and the sense diode region can therefore be detected correctly.

In the second semiconductor device described above, the high density n-type region may extend from the front surface to a position deeper than center portions in a thickness direction of the IGBT drift region and the diode drift region.

A third semiconductor device described herein comprises a semiconductor substrate including a main IGBT region in which an IGBT is provided, a main diode region in which a diode is provided, a sense IGBT region in which an IGBT is provided, and a sense diode region in which a diode is provided. An area of the sense IGBT region is smaller than an area of the main IGBT region. An area of the sense diode region is smaller than an area of the main diode region. An emitter region, a body region, an IGBT drift region, a collector region, a gate insulating film, and a gate electrode are provided in the sense IGBT region. The emitter region is of n-type and exposed on a front surface of the semiconductor substrate. The body region is of p-type and in contact with the emitter region. The IGBT drift region is separated from the emitter region by the body region. The collector region is of p-type, exposed on a rear surface of the semiconductor substrate, and separated from the body region by the IGBT drift region. The gate insulating film is in contact with the body region. The gate electrode faces the body region via the gate insulating film. An anode region, a diode drift region and a cathode region are provided in the sense diode region. The anode region is of p-type and exposed on the front surface of the semiconductor substrate. The diode drift region is in contact with the anode region. The cathode region is of n-type, separated from the anode region by the diode drift region, exposed on the rear surface of the semiconductor substrate, and has a higher n-type impurity density than the diode drift region. The body region is separated from the anode region by the IGBT drift region and the diode drift region. An insulating layer is provided between the IGBT drift region and the diode drift region.

Since in this semiconductor device the insulating layer is provided between the IGBT drift region and the diode drift region, the movement of carriers between the sense IGBT region and the sense diode region is suppressed. The current in each of the sense IGBT region and the sense diode region can therefore be detected correctly.

In the third semiconductor device described above, the insulating layer may extend from the front surface to a position deeper than center portions in a thickness direction of the IGBT drift region and the diode drift region.

DESCRIPTION OF EMBODIMENTS

First Embodiment

Figure 1:
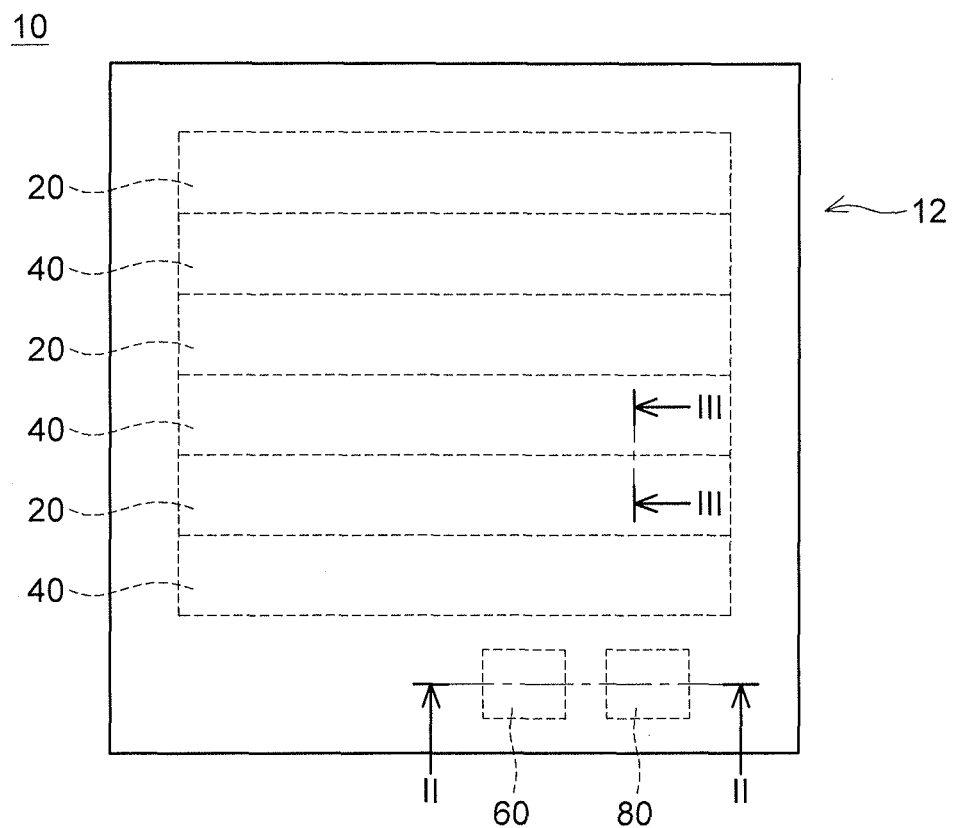
FIG. 1 shows a plan view of a semiconductor device 10.

A semiconductor device 10 in an embodiment shown in FIG. 1 has a semiconductor substrate 12 in which main IGBT regions 20, main diode regions 40, a sense IGBT region 60, and a sense diode region 80 are provided. There may hereinafter be a case where the main IGBT regions 20 and the main diode regions 40 are collectively referred to as a main region. Moreover, there may hereinafter be a case where the sense IGBT region 60 and the sense diode region 80 are collectively referred to as a sense region. The main region is provided in an approximately central portion of the semiconductor substrate 12. In the main region, a plurality of the main IGBT regions 20 and a plurality of the main diode regions 40 are alternately and repeatedly provided. The sense region is provided outside the main region. As shown in FIG. 1, when a front surface of the semiconductor substrate 12 is seen in a plan view, an area of the sense IGBT region 60 is smaller than an area of the main IGBT regions 20. If each IGBT is turned on, a current that corresponds to an area ratio of the sense IGBT region 60 to the main IGBT regions 20 flows through the sense IGBT region 60. By detecting the current that flows through the sense IGBT region 60, it is therefore possible to detect a current that flows through the main IGBT regions 20 at that time. Moreover, as shown in FIG. 1, when the front surface of the semiconductor substrate 12 is seen in a plan view, an area of the sense diode region 80 is smaller than an area of the main diode regions 40. Therefore, if each diode is turned on, a current that corresponds to an area ratio of the sense diode region 80 to the main diode regions 40 flows through the sense diode region 80. By detecting the current that flows through the sense diode region 80, it is therefore possible to detect a current that flows through the main diode regions 40.

Figure 2:
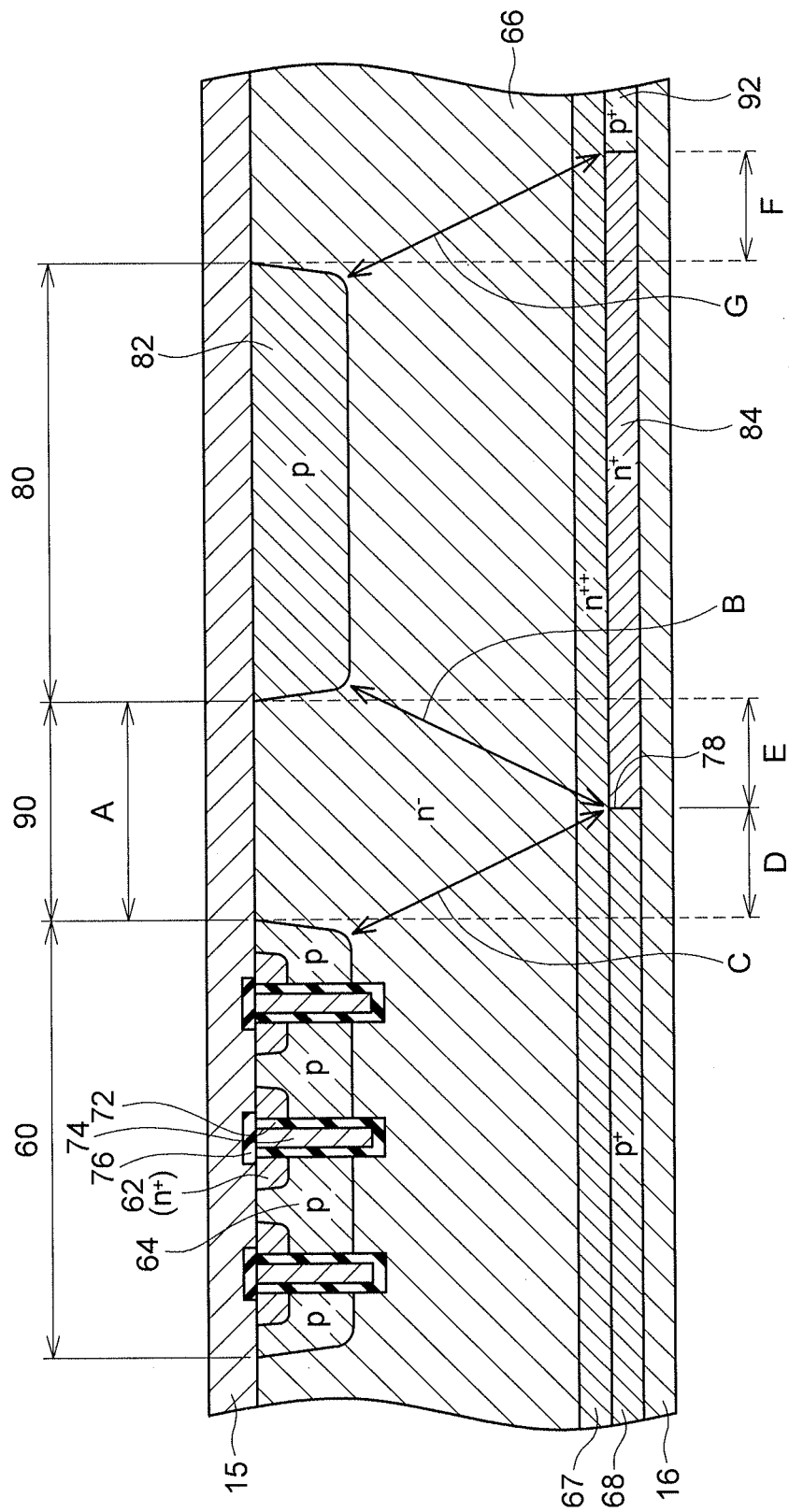
FIG. 2 shows a vertical cross-sectional view on a line II-II in FIG. 1.

FIG. 2 shows a cross-sectional structure of the sense region. In the sense region, a front surface electrode 15 is provided on the front surface of the semiconductor substrate 12, and a rear surface electrode 16 is provided on a rear surface of the semiconductor substrate 12.

Emitter regions 62, a body region 64, a drift region 66, a buffer region 67, and a collector region 68 are provided in the semiconductor substrate 12 in the sense IGBT region 60.

The emitter regions 62 are n-type regions, and provided in ranges exposed on an upper surface of the semiconductor substrate 12. The emitter regions 62 are ohmic-connected to the front surface electrode 15.

The body region 64 is a p-type region, and provided in a range exposed on the upper surface of the semiconductor substrate 12. The body region 64 extends from lateral sides of the emitter regions 62 to an underside of the emitter regions 62. The body region 64 is ohmic-connected to the front surface electrode 15.

The drift region 66 is an n-type region, and provided on an underside of the body region 64. The drift region 66 is separated from the emitter regions 62 by the body region 64. An n-type impurity density in the drift region 66 is preferably lower than $14 \times 10^{14}$ atoms/cm$^3$.

The buffer region 67 is an n-type region, and provided on an underside of the drift region 66. An n-type impurity density in the buffer region 67 is higher than that in each of the drift region 66 and a cathode region 84.

The collector region 68 is a p-type region, and provided on an underside of the buffer region 67. The collector region 68 is provided in a range exposed on a lower surface of the semiconductor substrate 12. The collector region 68 is ohmic-connected to the rear surface electrode 16. The collector region 68 is separated from the body region 64 by the drift region 66.

A plurality of trenches is provided in the upper surface of the semiconductor substrate 12 in the sense IGBT region 60. Each trench is provided at a position adjacent to the corresponding emitter region 62. Each trench extends to a depth at which it reaches the drift region 66.

An inner surface of each trench in the sense IGBT region 60 is covered with a gate insulating film 72. Moreover, a gate electrode 74 is disposed in each trench. Each gate electrode 74 is insulated from the semiconductor substrate 12 by the gate insulating film 72. Each gate electrode 74 faces the emitter region 62, the body region 64, and the drift region 66 via the gate insulating film 72. An insulating film 76 is provided on a top of each gate electrode 74. Each gate electrode 74 is insulated from the front surface electrode 15 by the insulating film 76.

An anode region 82, the drift region 66, the buffer region 67, and the cathode region 84 are provided in the semiconductor substrate 12 in the sense diode region 80.

The anode region 82 is provided in a range exposed on the upper surface of the semiconductor substrate 12. The anode region 82 is ohmic-connected to the front surface electrode 15.

The above-mentioned drift region 66 is provided on an underside of the anode region 82. The above-mentioned buffer region 67 is provided on the underside of the drift region 66.

The cathode region 84 is an n-type region, and provided on the underside of the buffer region 67 in the sense diode region 80. The cathode region 84 is provided in a range exposed on the lower surface of the semiconductor substrate 12. The cathode region 84 has a higher n-type impurity density than the drift region 66. The n-type impurity density in the cathode region 84 is preferably $1 \times 10^{18}$ atoms/cm$^3$ or higher. The cathode region 84 is ohmic-connected to the rear surface electrode 16.

The drift region 66 and the buffer region 67 mentioned above are provided in a separation region 90 between the sense IGBT region 60 and the sense diode region 80. In other words, the drift region 66 and the buffer region 67 extend continuously from an inside of the sense IGBT region 60 to an inside of the sense diode region 80. In other words, an n-type region formed of the drift region 66, the buffer region 67, and the cathode region 84 extends from the sense IGBT region 60 to the sense diode region 80, across the sense IGBT region 60 and the sense diode region 80. The body region 64 is separated from the anode region 82 by the drift region 66 located in the separation region 90. Moreover, the body region 64 is separated from the cathode region 84 by the drift region 66 located in the separation region 90. Moreover, the anode region 82 is separated from the collector region 68 by the drift region 66 located in the separation region 90. Moreover, the collector region 68 extends into the separation region 90, and the cathode region 84 extends into the separation region 90. A boundary 78 between the collector region 68 and the cathode region 84 is provided in the separation region 90.

Moreover, an external p-type region 92 is provided in a range exposed on the rear surface of the semiconductor substrate 12, in a region located on an opposite side of the collector region 68 with respect to the cathode region 84. In other words, the cathode region 84 is located between the external p-type region 92 and the collector region 68. The external p-type region 92 is separated from the anode region 82 by the drift region 66.

A distance A (the shortest distance) between the body region 64 and the anode region 82 is longer than a product of electron mobility in the drift region 66 and electron lifetime in the drift region 66. Accordingly, a flow of electrons between the body region 64 and the anode region 82 is prevented. Moreover, since hole mobility in the drift region 66 is smaller than electron mobility in the drift region 66, a flow of holes between the body region 64 and the anode region 82 is also prevented. A flow of a current between the body region 64 and the anode region 82 is therefore prevented.

A distance B (the shortest distance) between the anode region 82 and the collector region 68 is longer than a product of electron mobility in the drift region 66 and electron lifetime in the drift region 66. Notably, in the present embodiment, a thickness of the buffer region 67 is negligibly small relative to the thickness of the drift region 66. Accordingly, the distance B is set as described above, to thereby prevent a flow of electrons between the anode region 82 and the collector region 68. Moreover, since hole mobility in the drift region 66 is smaller than electron mobility in the drift region 66, a flow of holes between the anode region 82 and the collector region 68 is also prevented. A flow of a current between the anode region 82 and the collector region 68 is therefore prevented.

A distance C (the shortest distance) between the body region 64 and the cathode region 84 is longer than a product of electron mobility in the drift region 66 and electron lifetime in the drift region 66. Notably, in the present embodiment, the thickness of the buffer region 67 is negligibly small relative to the thickness of the drift region 66. Accordingly, the distance C is set as described above, to thereby prevent a flow of electrons between the body region 64 and the cathode region 84. Moreover, since hole mobility in the drift region 66 is smaller than electron mobility in the drift region 66, a flow of holes between the body region 64 and the cathode region 84 is also prevented. A flow of a current between the body region 64 and the cathode region 84 is therefore prevented. Notably, if the drift region 66 and the cathode region 84 are seen as a common n-type region, the above-mentioned distance C can also be said as a distance between the body region 64 and an end surface 78 of the collector region 68.

A distance G (the shortest distance) between the anode region 82 and the external p-type region 92 is longer than a product of electron mobility in the drift region 66 and electron lifetime in the drift region 66. Notably, in the present embodiment, the thickness of the buffer region 67 is negligibly small relative to the thickness of the drift region 66. Accordingly, the distance G is set as described above, to thereby prevent a flow of electrons between the anode region 82 and the external p-type region 92. Moreover, since hole mobility in the drift region 66 is smaller than electron mobility in the drift region 66, a flow of holes between the anode region 82 and the external p-type region 92 is also prevented. A flow of a current between the anode region 82 and the external p-type region 92 is therefore prevented.

Figure 3:
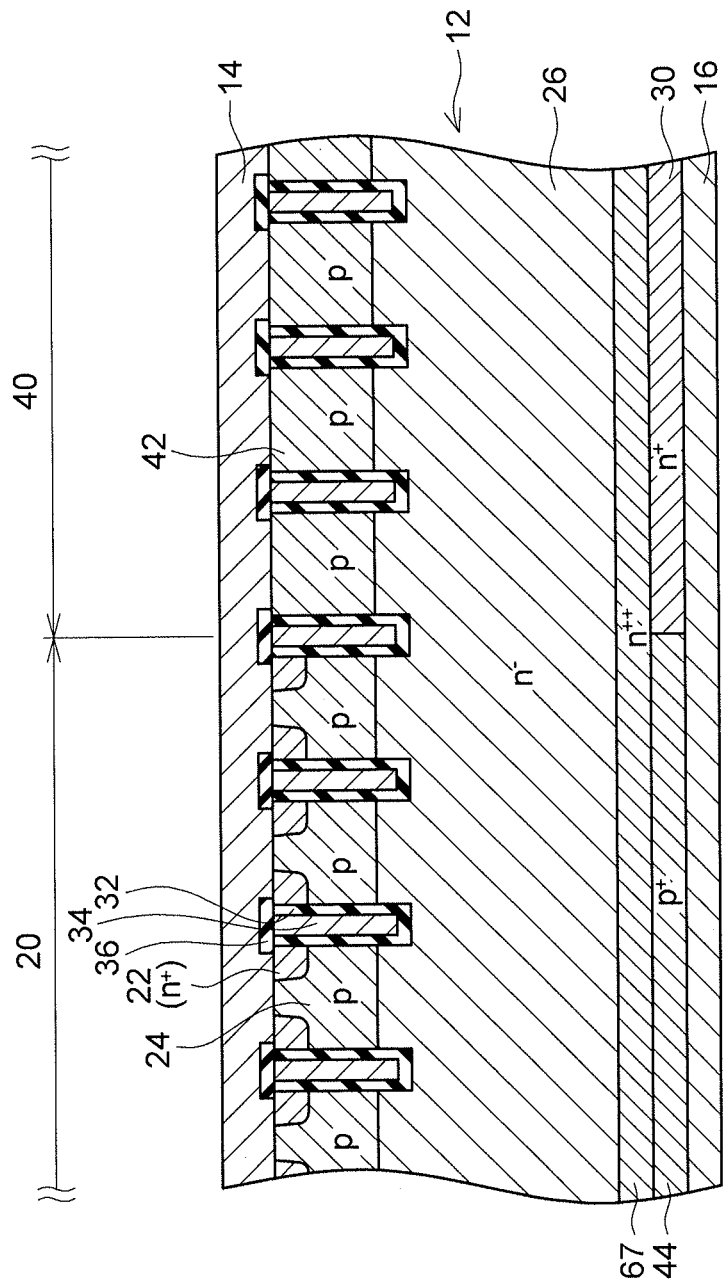
FIG. 3 shows a vertical cross-sectional view on a line in FIG. 1.

FIG. 3 shows a cross-sectional structure of the main region (the main IGBT region 20 and the main diode region 40). A front surface electrode 14 is provided on the front surface of the semiconductor substrate 12 in the main region. On the semiconductor substrate 12, the front surface electrode 14 is separated from the above-mentioned front surface electrode 15. The rear surface electrode 16, which is shared with the sense region, is provided on the rear surface of the semiconductor substrate 12 in the main region. Moreover, the drift, region 66 and the buffer region 67 mentioned above are also provided in the main region. In other words, the drift region 66 and the buffer region 67 extend across the main region to the sense region. A structure of the main IGBT regions 20 is approximately equal to that of the sense IGBT region 60. In other words, each of emitter regions 22, a body region 24, a collector region 44, gate electrodes 34, gate insulating films 32, and insulating films 36 in the main IGBT regions 20 has a configuration approximately similar to that in the sense IGBT region 60. Moreover, a structure of the main diode regions 40 is approximately equal to that of the sense diode region 80. In other words, each of an anode region 42 and a cathode region 30 in the main diode regions 40 has a configuration approximately similar to that in the sense diode region 80. Notably, the gate electrodes 34 and the gate insulating films 32 mentioned above are also provided in the main diode regions 40. It should be noted that, in other embodiments, the gate electrodes 34 and the gate insulating films 32 may not be provided in the main diode regions 40.

Next, an operation of the IGBT in the sense region will be described. When the rear surface electrode 16 is at a higher potential relative to the potential of the front surface electrode 15, and a potential that is equal to or higher than a threshold value is applied to the gate electrodes 74, the IGBT in the sense IGBT region 60 is turned on. In other words, channels are formed in the body region 64 in proximity of the gate insulating films 72, causing electrons to flow from the front surface electrode 15 to the rear surface electrode 16 through the emitter regions 62, the channels, the drift region 66, the buffer region 67, and the collector region 68. Moreover, holes flow from the rear surface electrode 16 to the front surface electrode 15 through the collector region 68, the buffer region 67, the drift region 66, and the body region 64. Accordingly, in the sense IGBT region 60, a current flows from the rear surface electrode 16 toward the front surface electrode 15. At this occasion, since a reverse voltage is applied to the diode in the sense diode region 80, the diode is off. In other words, no current flows through the sense diode region 80. Here, since each of the above-mentioned distances A, B, and C is set to a distance that does not allow any current to flow therein, a flow of a current between the sense IGBT region 60 and the sense diode region 80 is prevented. In other words, a current interference between the sense IGBT region 60 and the sense diode region 80 is prevented.

At this occasion, the IGBT and the diode in the main region operate similarly to the IGBT and the diode in the sense region, respectively. Therefore, when a current flows through the IGBT in the sense region, a current also flows through the IGBT in the main region. As described above, since a current interference in the sense region is prevented, a ratio between the current that flows through the sense IGBT region 60 and the current that flows through the main IGBT regions 20 becomes much closer to the ratio between the area of the sense IGBT region 60 and the area of the main IGBT regions 20. Therefore, by detecting the current that flows through the sense IGBT region 60 (i.e., the current that flows through the front surface electrode 15 in the sense region), it is possible to correctly detect a current that flows through the main IGBT regions 20.

Next, an operation of the diode in the sense region will be described. When the front surface electrode 15 becomes at a higher potential relative to the potential of the rear surface electrode 16, the diode in the sense diode region 80 is turned on. In other words, electrons flow from the rear surface electrode 16 to the front surface electrode 15 through the cathode region 84, the buffer region 67, the drift region 66, and the anode region 82. Moreover, holes flow from the front surface electrode 15 to the rear surface electrode 16 through the anode region 82, the drift, region 66, the buffer region 67, and the cathode region 84. Accordingly, in the sense diode region 80, a current flows from the front surface electrode 15 toward the rear surface electrode 16. At this occasion, since a reverse voltage is applied to the IGBT in the sense IGBT region 60, the IGBT is off. In other words, no current flows through the sense IGBT region 60. Here, since each of the above-mentioned distances A, B, and C is set to a distance that does not allow any current to flow therein, a flow of a current between the sense IGBT region 60 and the sense diode region 80 is prevented. Moreover, since the above-mentioned distance G is set to a distance that does not allow any current to flow therein, a flow of a current between the anode region 82 and the external p-type region 92 is prevented. In other words, a current interference between the sense diode region 80 and each of its peripheral regions (i.e., the sense IGBT region 60 and the external p-type region 92) is prevented.

At this occasion, the IGBT and the diode in the main region operate similarly to the IGBT and the diode in the sense region, respectively. Therefore, when a current flows through the diode in the sense region, a current also flows through the diode in the main region. As described above, since a current interference in the sense region is prevented, a ratio between the current that flows through the sense diode region 80 and the current that flows through the main diode regions 40 becomes much closer to the ratio between the area of the sense diode region 80 and the area of the main diode regions 40. Therefore, by detecting the current that flows through the sense diode region 80 (i.e., the current that flows through the front surface electrode 15 in the sense region), it is possible to correctly detect a current that flows through the main diode regions 40.

Notably, electron mobility changes depending on temperature. Therefore, each of the distances A, B, and C is preferably set based on a temperature of the semiconductor device 10 during an operation. For example, if the semiconductor substrate 12 is made of silicon, has a thickness of 165 μm, and has an operating temperature of 150° C., and the drift region 66 has an n-type impurity density of $1\times10^{15}$ to $10^{17}$ atoms/cm$^3$, each of distances D, E, and F shown in FIG. 2 can be set to 580 μm or longer, to thereby set each of the above-mentioned distances A, B, C, and G to a distance that causes no current interference. Notably, the distance D is a distance between the body region 64 and the boundary 78 in a transverse direction (a direction parallel to the rear surface of the semiconductor substrate 12), the distance E is a distance between the anode region 82 and the boundary 78 in the transverse direction, and the distance F is a distance between the anode region 82 and the external p-type region 92 in the transverse direction.

Second Embodiment

Figure 4:
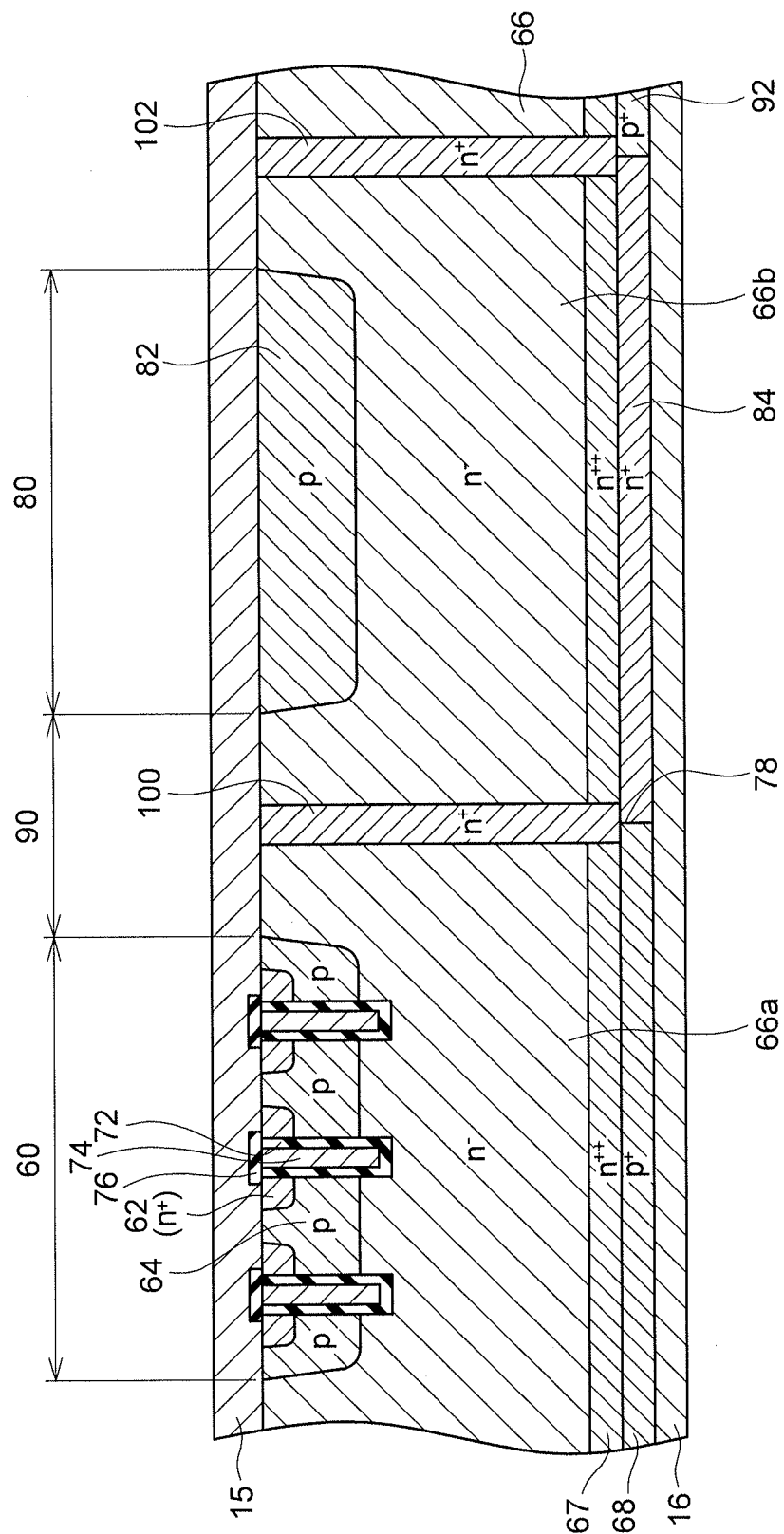
FIG. 4 shows a vertical cross-sectional view of a semiconductor device in a second embodiment, the view corresponding to FIG. 2.

A configuration of a semiconductor device in a second embodiment is equal to that of the semiconductor device 10 in the first embodiment, except for high density n-type regions 100 and 102. In the semiconductor device in the second embodiment, as shown in FIG. 4, the high density n-type region 100 is provided in the semiconductor substrate 12 in the separation region 90. The high density n-type region 100 has a higher n-type impurity density than the drift region 66. The n-type impurity density in the high density n-type region 100 is preferably $1\times10^{16}$ atoms/cm$^3$ or higher. The high density n-type region 100 extends from the front surface of the semiconductor substrate 12 to the boundary 78 between the collector region 68 and the cathode region 84. Accordingly, the drift region 66 is divided into an IGBT drift region 66a and a diode drift region 66b. Moreover, the high density n-type region 102, which is approximately similar to the high density n-type region 100, is also provided on a boundary between the external p-type region 92 and the cathode region 84. Notably, in the semiconductor device in the second embodiment, each of the above-mentioned distances A to G may be set arbitrarily.

Each of the above-mentioned high density n-type regions 100 and 102 has n-type impurities in a high density. The N-type impurities scatter carriers. Since the high density n-type region 100 is provided between the sense IGBT region 60 and the sense diode region 80, the high density n-type region 100 prevents a current interference between the sense IGBT region 60 and the sense diode region 80. Moreover, since the high density n-type region 102 is provided between the sense diode region 80 and the external p-type region 92, the high density n-type region 102 prevents a current interference between the sense diode region 80 and the external p-type region 92. Therefore, by detecting the current in the sense IGBT region 60, it is possible to correctly detect a current in the main IGBT regions 20. Moreover, by detecting the current in the sense diode region 80, it is possible to correctly detect a current in the main diode regions 40.

Notably, in FIG. 4, although the high density n-type regions 100 and 102 extend from the front surface of the semiconductor substrate 12 to the regions on the rear surface side of the semiconductor substrate 12 (i.e., the collector region 68, the cathode region 84, and the external p-type region 92), the high density n-type regions 100 and 102 may be provided exclusively in a shallower region. In other words, the high density n-type regions may be provided from the front surface of the semiconductor substrate 12 to a prescribed depth, and the drift region 66 may be provided on an underside of those high density n-type regions (i.e., the IGBT drift region 66a and the diode drift region 66b do not have to be separated completely). It should be noted that, in this case, each of the high density n-type regions 100 and 102 preferably extends from the front surface of the semiconductor substrate 12 to a position deeper than an center portion in the thickness direction of the drift region 66. By providing each of the high density n-type regions to such a degree of depth, it is possible to effectively suppress a current interference. Moreover, in FIG. 4, although the high density n-type regions 100 and 102 are provided to be exposed on the front surface of the semiconductor substrate 12, an upper end of each of the high density n-type regions may be located inside the semiconductor substrate 12. In this case, another semiconductor layer (e.g., the drift region 66) resultantly exists between the upper end of each of the high density n-type regions and the front surface of the semiconductor substrate 12. Even with such a configuration, if a clearance between the upper end of each of the high density n-type regions and the front surface of the semiconductor substrate 12 is extremely small, a current interference can sufficiently be suppressed.

Third Embodiment

Figure 5:
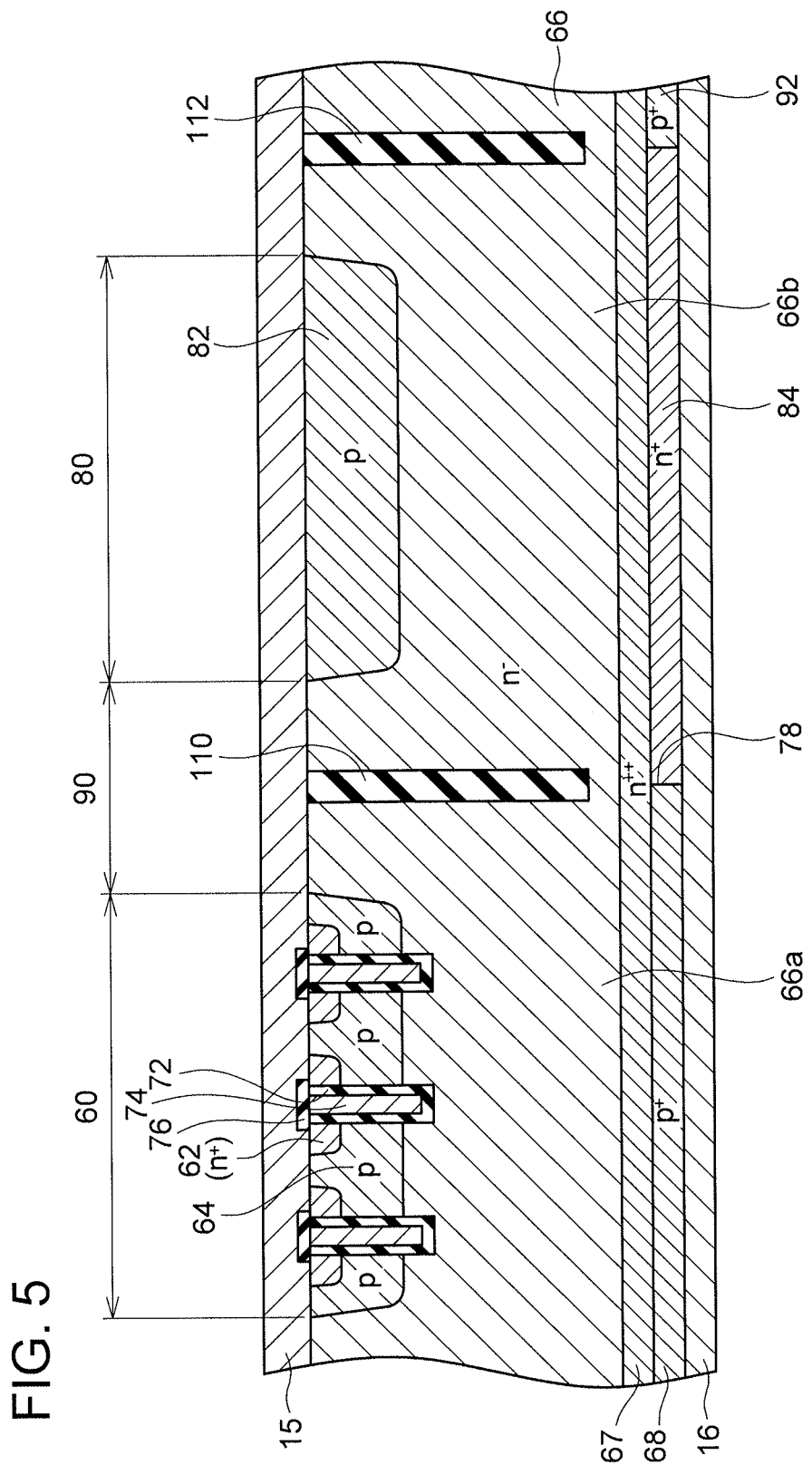
FIG. 5 shows a vertical cross-sectional view of a semiconductor device in a third embodiment, the view corresponding to FIG. 2.

A configuration of a semiconductor device in a third embodiment is equal to that of the semiconductor device 10 in the first embodiment, except for insulating layers 110 and 112. In the semiconductor device in the third embodiment, as shown in FIG. 5, a trench may be provided in the front surface of the semiconductor substrate 12 in the separation region 90, and the insulating layer 110 may be provided in the trench. The insulating layer 110 extends from the front surface of the semiconductor substrate 12 into the drift region 66. The drift region 66 exists on an underside of a lower end of the insulating layer 110. In other words, in the third embodiment, the IGBT drift region 66a and the diode drift region 66b are not separated completely. Moreover, the insulating layer 112, which is similar to the insulating layer 110, is also provided above the boundary between the external p-type region 92 and the cathode region 84. Notably, in the semiconductor device in the third embodiment, each of the above-mentioned distances A to G may be set arbitrarily.

Since the insulating layer 110 is provided between the sense IGBT region 60 and the sense diode region 80, the insulating layer 110 prevents a current interference between the sense IGBT region 60 and the sense diode region 80. Moreover, since the insulating layer 112 is provided between the sense diode region 80 and the external p-type region 92, the insulating layer 112 prevents a current interference between the sense diode region 80 and the external p-type region 92. Therefore, by detecting the current in the sense IGBT region 60, it is possible to correctly detect a current in the main IGBT regions 20. Moreover, by detecting the current in the sense diode region 80, it is possible to correctly detect a current in the main diode regions 40.

Notably, in the third embodiment, each of the insulating layers 110 and 112 preferably extends from the front surface of the semiconductor substrate 12 to a position deeper than the center portion in the thickness direction of the drift region 66. By providing each of the insulating layers to such a degree of depth, it is possible to effectively suppress a current interference. Moreover, each of the insulating layers 110 and 112 may penetrate the drift layer 66. Moreover, in FIG. 5, although the insulating layers 110 and 112 are provided to be exposed on the front surface of the semiconductor substrate 12, an upper end of each of the insulating layers may be located inside the semiconductor substrate 12. In other words, the insulating layers may be embedded in the semiconductor substrate 12. In this case, another semiconductor layer (e.g., the drift region 66) resultantly exists between the upper end of each of the insulating layers and the front surface of the semiconductor substrate 12. Even with such a configuration, if a clearance between the upper end of each of the insulating layers and the front surface of the semiconductor substrate 12 is extremely small, a current interference can sufficiently be suppressed.

Notably, although the semiconductor devices each having a trench-type gate electrode have been described in each of the first to third embodiments mentioned above, the art disclosed in the present specification may also be applied to a semiconductor device having a planar-type gate electrode.

Moreover, in other embodiments, the buffer region 67 may not be provided. In this case, the collector region 68, the cathode region 84, and the external p-type region 92 are in contact with the drift region 66.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device, comprising a semiconductor substrate including a main IGBT region in which an IGBT is provided, a main diode region in which a diode is provided, a sense IGBT region in which an IGBT is provided, and a sense diode region in which a diode is provided,
   a front surface electrode provided on a front surface of the semiconductor substrate, and
   a rear surface electrode provided on a rear surface of the semiconductor substrate,
   wherein
   an area of the sense IGBT region is smaller than an area of the main IGBT region,
   an area of the sense diode region is smaller than an area of the main diode region,
   an emitter region, a body region, an IGBT drift region, a collector region, a gate insulating film, and a gate electrode are provided in the sense IGBT region,
   the emitter region is of n-type and in direct contact with the front surface electrode,
   the body region is of p-type and in direct contact with the emitter region,
   the IGBT drift region is of n-type, in direct contact with the body region, and separated from the emitter region by the body region,
   the collector region is of p-type, in direct contact with the IGBT drift region, in direct contact with the rear surface electrode, and separated from the body region by the IGBT drift region,
   the gate insulating film is in direct contact with the body region, and
   the gate electrode faces the body region via the gate insulating film,
   an anode region, a diode drift region and a cathode region are provided in the sense diode region,
   the anode region is of p-type and in direct contact with the front surface electrode,
   the diode drift region is in direct contact with the anode region,
   the cathode region is of n-type, is separated from the anode region by the diode drift region, is in direct contact with the rear surface electrode, and has a higher n-type impurity density than the diode drift region,
   wherein
   the body region is separated from the anode region by the IGBT drift region and the diode drift region,
   a high density n-type region having a higher n-type impurity density than the IGBT drift region and the diode drift region is provided between the IGBT drift region and the diode drift region, and
   the high density n-type region extends from the front surface to a position deeper than center portions of the IGBT drift region and the diode drift region in a thickness direction of the IGBT drift region and the diode drift region.

2. The semiconductor device of claim 1, wherein the cathode region is located right below the anode region.

3. The semiconductor device of claim 1, wherein
   the high density n-type region is in direct contact with the IGBT drift region and the diode drift region.

4. The semiconductor device of claim 1, wherein the high density n-type region extends from the front surface to a position being in direct contact with the collector region and the cathode region.

* * * * *